United States Patent [19]

Brown et al.

[11] Patent Number: 4,952,843
[45] Date of Patent: Aug. 28, 1990

[54] HIGH CURRENT ION SOURCE

[76] Inventors: Ian G. Brown, 1088 Woodside Rd., Berkeley, Calif. 94708; Robert A. MacGill, 645 Kern St., Richmond, Calif. 94805; James E. Galvin, 2 Commodore Dr. #276, Emeryville, Calif. 94608

[21] Appl. No.: 320,475

[22] Filed: Mar. 8, 1989

[51] Int. Cl.$^5$ .......................... H01J 7/24; H05B 31/26
[52] U.S. Cl. .......................... 315/111.81; 315/111.41; 315/111.91; 250/423 R
[58] Field of Search ...................... 315/111.81, 111.41, 315/111.91, 111.31; 313/231.41; 250/425, 423 R

[56] References Cited

U.S. PATENT DOCUMENTS

| | | | |
|---|---|---|---|
| 4,481,062 | 11/1984 | Kaufman et al. | 250/423 R X |
| 4,611,721 | 9/1986 | Miyamura et al. | 313/231.41 X |
| 4,714,860 | 12/1987 | Brown et al. | 315/111.81 |
| 4,782,235 | 11/1988 | Lejeune et al. | 315/111.81 X |

OTHER PUBLICATIONS

"Magnetic Multipole Containment of Large Uniform Collision Less Quiescent Plasmas"-Rudolf Limpaecher et al, Rev. Sci. Instrum., vol. 44, No. 6, Jun. 1973, pp. 726-731.
"A Large Volume Quiescent Plasma in a Uniform Magnetic Field"—Earl R. Ault et al, Rev. Sci. Instrum., vol. 44, No. 12, 12/1973, pp. 1697-1699.

*Primary Examiner*—Eugene R. Laroche
*Assistant Examiner*—Seung Ham
*Attorney, Agent, or Firm*—Theodore J. Bielen, Jr.; Richard Esty Peterson; Thomas Lampe

[57] ABSTRACT

An ion source utilizing a cathode and anode for producing an electric arc therebetween. The arc is sufficient to vaporize a portion of the cathode to form a plasma. The plasma leaves the generation region and expands through another regon. The density profile of the plasma may be flattened using a magnetic field formed within a vacuum chamber. Ions are extracted from the plasma to produce a high current broad on beam.

20 Claims, 4 Drawing Sheets

4,952,843

HIGH CURRENT ION SOURCE

The government has rights in this invention pursuant to contract no. DE-AC03-76SF00098 awarded in the U.S. Department of Energy.

BACKGROUND OF THE INVENTION

The present invention relates to a novel high current ion beam generating apparatus.

U.S. Pat. No. 4,714,860 to Brown et al describes an ion beam generating apparatus which was a significant advance in the field of beams, plasmas and ion beam generation. As noted in the prior art ion beams are quite useful for implanting ions in metals, ceramics, and the like, to change physical characteristics of the same. Where the ion beam is composed of metallic ions the metal vapor vacuum arc source described in the U.S. Pat. No. 4,714,860 has proved to be prolific generator of plasmas containing such ions. Prior proposed ion beam generating apparatuses, including the metal vapor vacuum arc source, utilized convergent wall portions and orifices to direct the plasma plume from the generation region to the extraction region. Unfortunately, although the plasma plume was successfully transported, much of the plasma was wasted or expended in these prior apparatuses. It has been calculated that the maximum efficiency in comparing the ion beam current to the arc current was approximately 0.2% in such prior art devices.

Articles by Limpaecher et al and Ault et al have described confinement of a plasma by a magnetic multipole cusp field produced by a series of ceramic permanent magnets. These prior art magnetic field devices, however, did not consider plasma expansion and ion extraction.

Increasing ion beam current with prior devices requires the increasing of arc current and appurtenant components. In a relatively inefficient system an increase in ion beam current requires a relatively large increase in the sizing of plasma generating components.

An ion source apparatus which is capable of utilizing a metal vapor vacuum arc to produce an ion beam of greatly increased intensity would be a significant advance in the field of ion beam generation.

SUMMARY OF THE INVENTION

In accordance with the present invention a novel and useful ion source originating with a plasma is provided.

The ion source of the present invention utilizes a cathode and anode spaced apart within a vacuum chamber. Means is provided for producing an electrical arc between the anode and cathode to vaporize and ionize a portion of the cathode to form a plasma. The plasma is generated in a first region and permitted to expand to a second region in a vacuum chamber. The second region is defined to permit physical expansion of the plasma transversely along a line connecting first and second regions. In this regard, the second region includes a first portion adjacent the first region and a second portion spaced further from the first region than the first portion of the second region. The second portion of the second region would possess a larger transverse dimension than the first portion of the second region. Thus, the second region has diverging wall portions relative to the first region.

Means may also be included for producing a magnetic field within the second region to flatten the density profile of the plasma in its expansion in the second region. Such flattening may be confined to the vicinity of the diverging walls of the second region. In this regard the magnetic means may include a plurality of permanent magnets placed within the vacuum chamber in spaced relationship to one another. The permanent magnets may take the form of elongated bar magnets which may be connected electrically to the anode of the plasma generating first region. Thus, the axis of the elongation of the bar magnets would lie in diverging relationship with the axis lining the first and second regions. Such elongated permanent magnets may be electrically linked to the anode by a holding device. Such device would be positioned concentrically in the second region and may be constructed with means for fixing the plurality of magnets in the heretofore described diverging relationship. Such means may include a plurality of grooves formed in the electrically conductive holding device. It has been found that the plasma producing portion of the ion source above described possesses an efficiency of 10 to 100 times as great as the prior art apparatuses.

Means may also be included for extracting ions from the expanded and "flattened" plasma in a third region. Such third region may lie adjacent to the portion of the second region having the larger transverse dimension. Such extraction means may include a series of grids disclosed in the prior art but of a far larger transverse dimension and extraction capacity. Thus, an ion beam of much greater strength and diameter is produced in the apparatus of the present invention.

It may be apparent that a novel and useful ion source is herein provided.

It is therefore an object of the present invention to provide ion source which is capable of generating an ion beam current of a relatively high magnitude.

It is another object of the present invention to provide an ion source which is capable of utilizing a metal vapor vacuum arc source and a relatively large extractor which is less susceptible to an electrical breakdown than extractors of the prior art.

It is another object of the present invention to provide an ion source which utilizes a metal vapor vacuum arc source and is able to substantially form an ion beam utilizing almost all of the plasma produced by the metal vacuum vapor arc source.

A further object of the present invention is to provide an ion source employing a generated plasma plume which is caused to expand and is density profiled for efficient extraction of ions.

Yet another object of the present invention is to provide an ion source which may utilize permanent magnets for confining a plasma generated by a metal vapor vacuum arc source, which can also serve as a portion of the anode.

A further object of the present invention is to provide an ion source which permits the reduction of the arc current needed to generate a high current ion beam, thus reducing the size of the plasma generating mechanism and the cooling requirements therefore.

Yet another object of the present invention is to provide an ion source which produces an ion beam having a shape that is larger and more uniform than prior art ion beams, and is more suitable for ion implantation, thereby.

The invention possesses other objects and advantages especially as concerns particular characteristics and features thereof which will become apparent as the specification continues.

Figure 1:
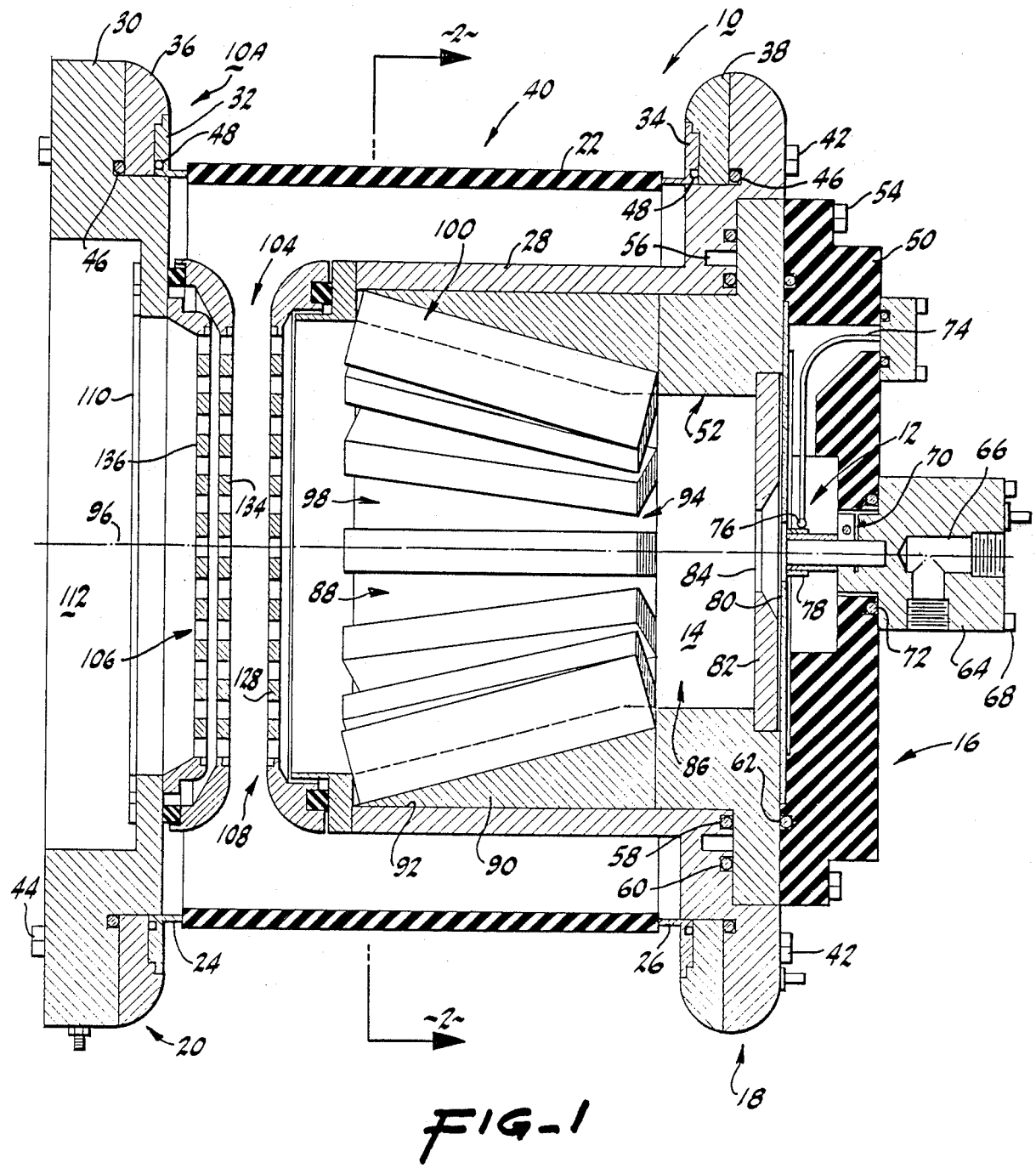
FIG. 1 is a sectional view of the ion source apparatus of the present invention.

For a better understanding of the invention reference is made to the following detailed description thereof which should be reference to the hereinabove described drawings.

DESCRIPTION OF THE PREFERRED EMBODIMENTS

Various aspects of the present invention will evolve from the following detailed description of thereof which should be compared to the heretofore described drawings.

The apparatus as a whole is shown in the drawings by reference character 10. The apparatus 10 may be deemed to include an apparatus for generating plasma or an apparatus 10A for producing a ion beam. In the former case, the plasma generating apparatus 10 includes as one of its elements a cathode 12. Cathode 12 lies within a vacuum chamber 14 formed by a housing 16. End portions 18 and 20 generally form the extremities of vacuum chamber 14 between a cylindrical insulator member 22. Flanges 24 and 26 connect to insulator member 22 and extend into contact with extractor holder 28 and ground flange 30. Inserts 32 and 34 and assembly member 36 and 38 constitute the main insulator assembly unit 40. Ground flange 30 and extractor holder 28 attach to assembly unit 40 by plurality of machine screws 42 and 44. Multiplicity of "O" rings 46 and 48 maintain the integrity of the vacuum within chamber 14. Cathode-anode insulator 50 is held to magnetic support assembly 52 by plurality of fasteners 54. Cathode-anode insulator 50 may be constructed of boron nitride or similar material. Coolant passage 56 removes heat from extractor holder 28 and is found between "O" rings 58 and 60. "O" ring 62 lies between magnetic support assembly 52 and cathode-anode insulator 50. As is the case pertaining to plurality or multiplicity of "O" rings 46, "O" rings 58, 60, and 62 also aid in the maintenance of the vacuum condition within chamber 14.

Cathode mount 64, having coolant passage 66 therethrough, fixes to cathode-anode insulator 50 via fasteners 68. Cathode mount 64 holds cathode 12 in place by the use of clamp 70. "O" ring 72 maintains the vacuum condition in the vicinity of cathode 12.

Trigger lead 74 terminates in a contact 76 lying atop cathode trigger insulator 78 which may be formed of alumina, FIG. 1. Optional shield plate 80 may be included in the apparatus 10, 10A. Such shield plate 80 may be formed of quartz or like material. Anode 82 is held in position at the corner of magnetic support assembly 52. Anode 82 includes an opening 84. Cathode 12, anode 82, and trigger contact 76 mark first region 86 of apparatus 10, 10A, in which a plasma plume is generated.

Figure 2:
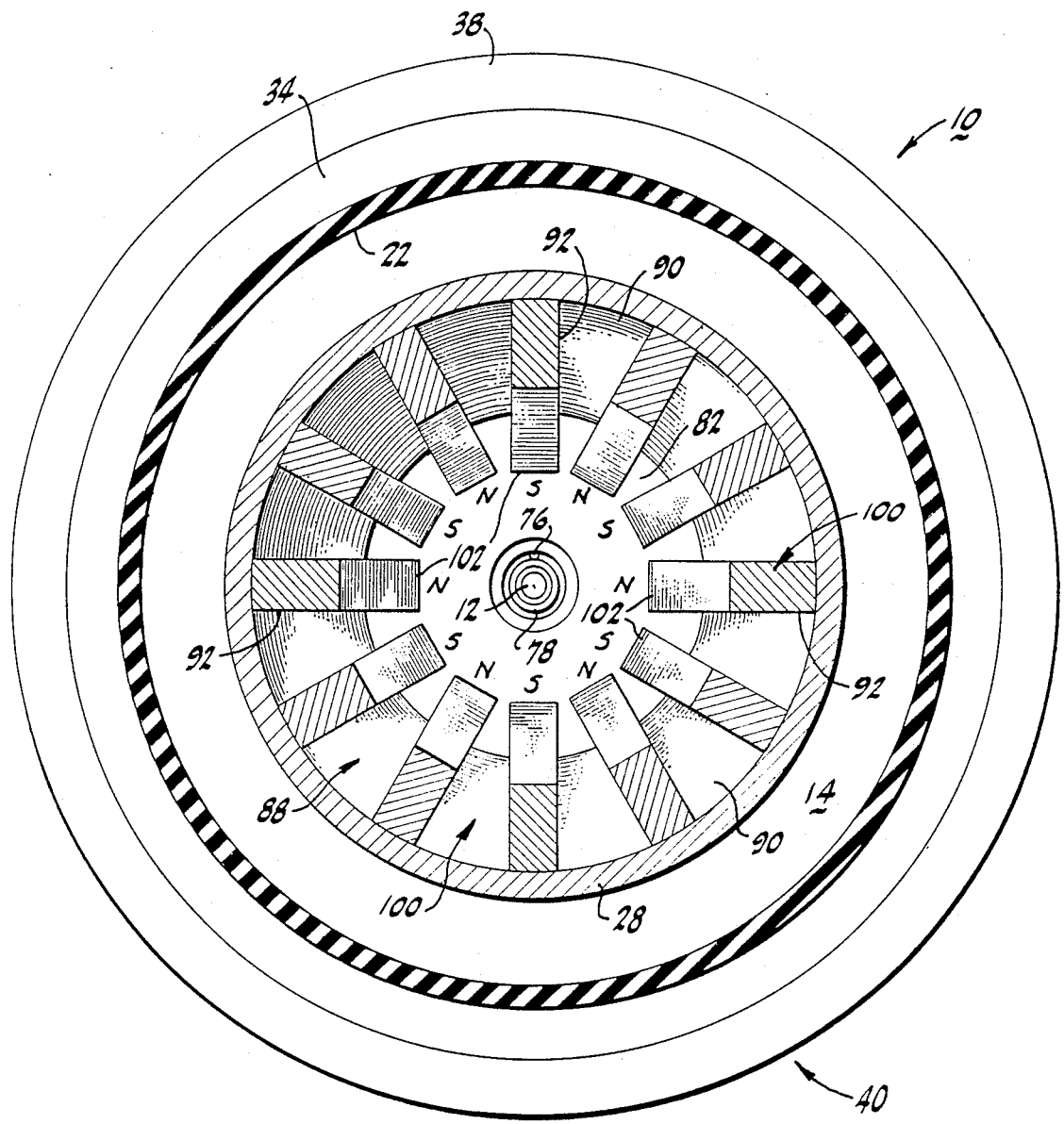
FIG. 2 is a sectional view taken along line 2—2 of FIG. 1.

A second region 88 is employed to permit expansion of the plasma traveling from first region 86. The boundary of second region 88 is generally marked by the perimeter of magnetic holder or support 90. As depicted in FIG. 1, magnetic support 90 is a generally conical shaped object having a plurality of radiant grooves, FIG. 2 92. Second region 88 includes a first portion 94 of relatively narrow transverse dimension relative to axis 96, and a second portion 98 of a relatively large transverse dimension relative to axis 96. Thus, plurality of grooves 92 in holder 90 extend along axis 96 and radiate outwardly therefrom, when moving from first portion 94 to second portion 98 of region 88. It should be noted that magnetic support 90 and magnetic assembly 52 may be formed as one piece, although they are depicted as separate pieces fastened together in FIG. 1.

Means 100 produces a magnetic field in second region 88. Means 100 is shown in the preferred embodiment as a plurality of permanent samarium-colbalt bar magnets 102 which fit in plurality of grooves 92. Since magnetic support 90 is formed of magnetic material such as steel, plurality of magnets 102 are held within plurality of grooves 92 by the magnetic force inherent in plurality of magnets 102. As depicted on FIG. 2, plurality of bar magnets 102 alternate north-south orientations around periphery of second region 88. It should be noted that magnetic support assembly 52 electrically links to anode 82. Thus, plurality of magnets 102 also serve as part of anode 82.

Third region 104 includes a plurality of grids 106 for the extraction of ions from the plasma expanded through second region 88. Thus, the addition of means for extraction 108 of ions from the plasma marks the difference between apparatus 10 for generating a plasma and apparatus 10A for generating ions. An ion beam would exit third region 104, through a lining ring 110 and onto target area 112. It should be noted that target area 112 remains under a vacuum and may include metallic objects, ceramic objects, and the like receiving an ion beam for the purpose of implantation of the same.

Figure 5:
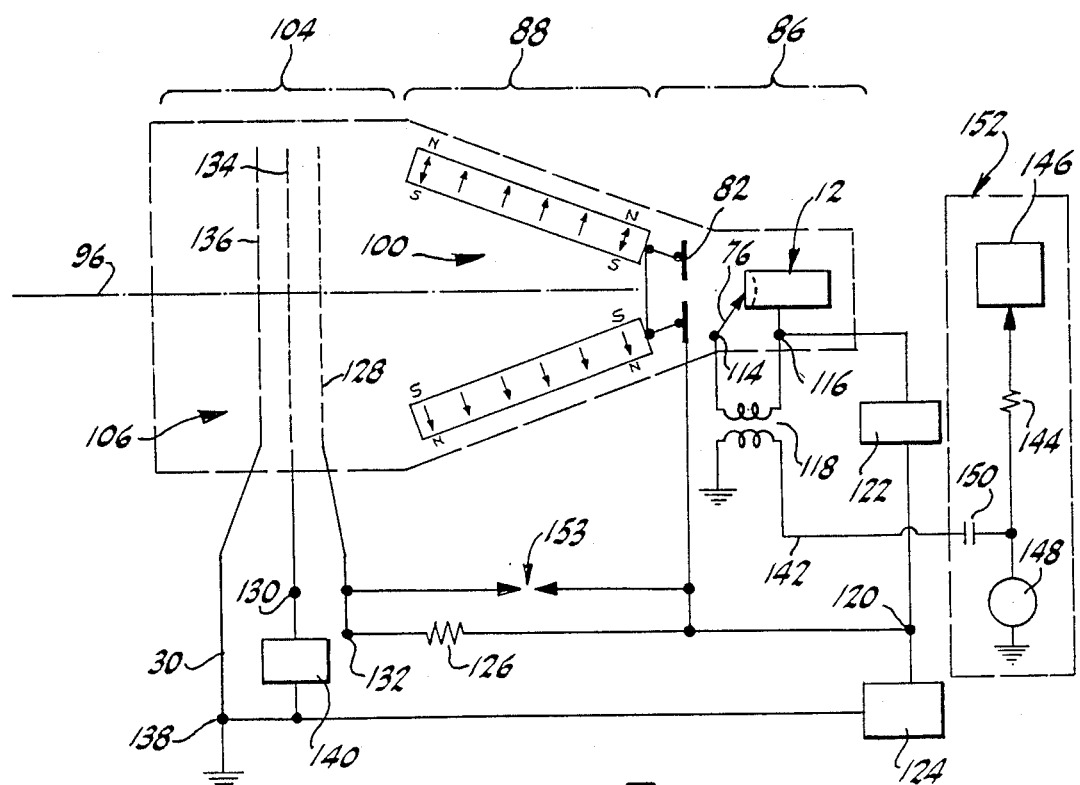
FIG. 5 is a schematic view of the electrical circuitry employed in the present invention.

In operation, electrical terminals 114 and 116 are connected to pulse transformer 118, FIG. 5. Terminal 120 links the positive leads of the arc and extractor power supplies 122 and 124. Terminal 120 also leads to resistor 126 intermediate anode 82 and grid 128. Terminals or fittings 130 and 132 connect to grids 128 and 134, respectively. Grid 136 is grounded through ground flange 30 and fitting 138. It should be noted that grid 128, the source grid or extractor, connects to anode 82 and extractor power supply 124 through resistor 126. Grid 134, referred to as the extractor or suppressor grid, is connected to suppressor power supply 140. The electric field formed between grids 128 and 134 extracts and accelerates ions from plasma in second region 88, which will be discussed hereinafter. Coolant is circulated through coolant passages 56 and 66. Power supplies 122, 124, and 140 are turned "on". Input lead 142 to pulse transformer 118 may take the form of the circuit illustrated in FIG. 5 utilizing resistor 144, power supply 146, electron tube 148, and capacitor 150. Such components may be referred to as pulsing circuit 152. At this point pulsing circuit 152 is activated to fire trigger electrode 76 at a rate of several pulses per second. The spark between electrode 76 and cathode 12 initiates the arc between cathode 12 and anode 82. Overvoltage protector 153 prevents electrical breakdown between various components of apparatus 10 during electrical conditioning or operation. It should be noted that magnetic means 100 is electrically connected to anode 82. This increases efficiency in the plasma source such that anode 82 serves as an anode in the early part of the plasma discharge. Anode 182 does not block plasma flow from region 86 and the plasma tends to "choose" the most convenient portion of the anode after establishment. It has been found that the plasma current will be split between the anode 82 in region 86 and the portion of magnetic means 100 serving as an anode. Thus, region 88 may partially serve as a place of generation of the plasma. The plasma plume generally, then travels from first region 86 to expansion region 88.

Figure 4:
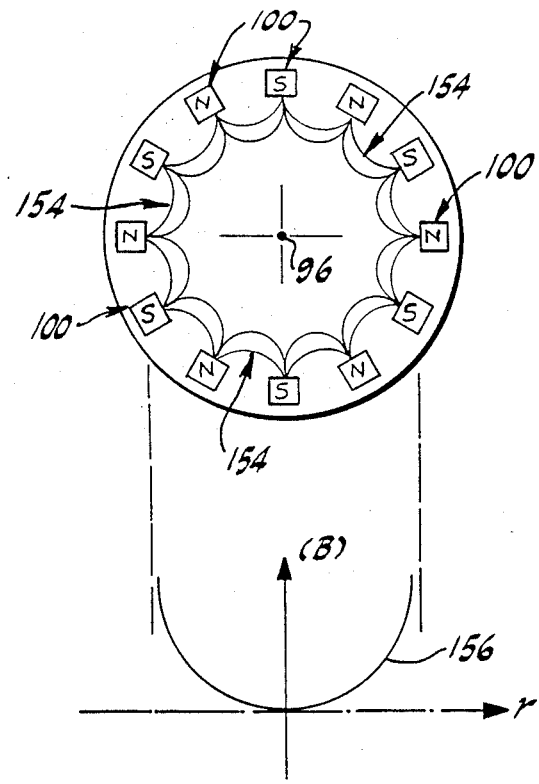
FIG. 4 is a schematic view of the "magnetic walls" associated with the apparatus of the present invention.

With reference to FIG. 4 it may be seen that magnetic means 100 produces magnetic field 154 which is shown graphically as having an intensity (B) as the distance r from axis 96 increases. The magnetic field in 154 possesses an intensity which is very low near axis 96 and quite high near the plurality of magnets 100. Thus a "magnetic wall" 156 tends to form near the periphery of second region 88.

Figure 3:
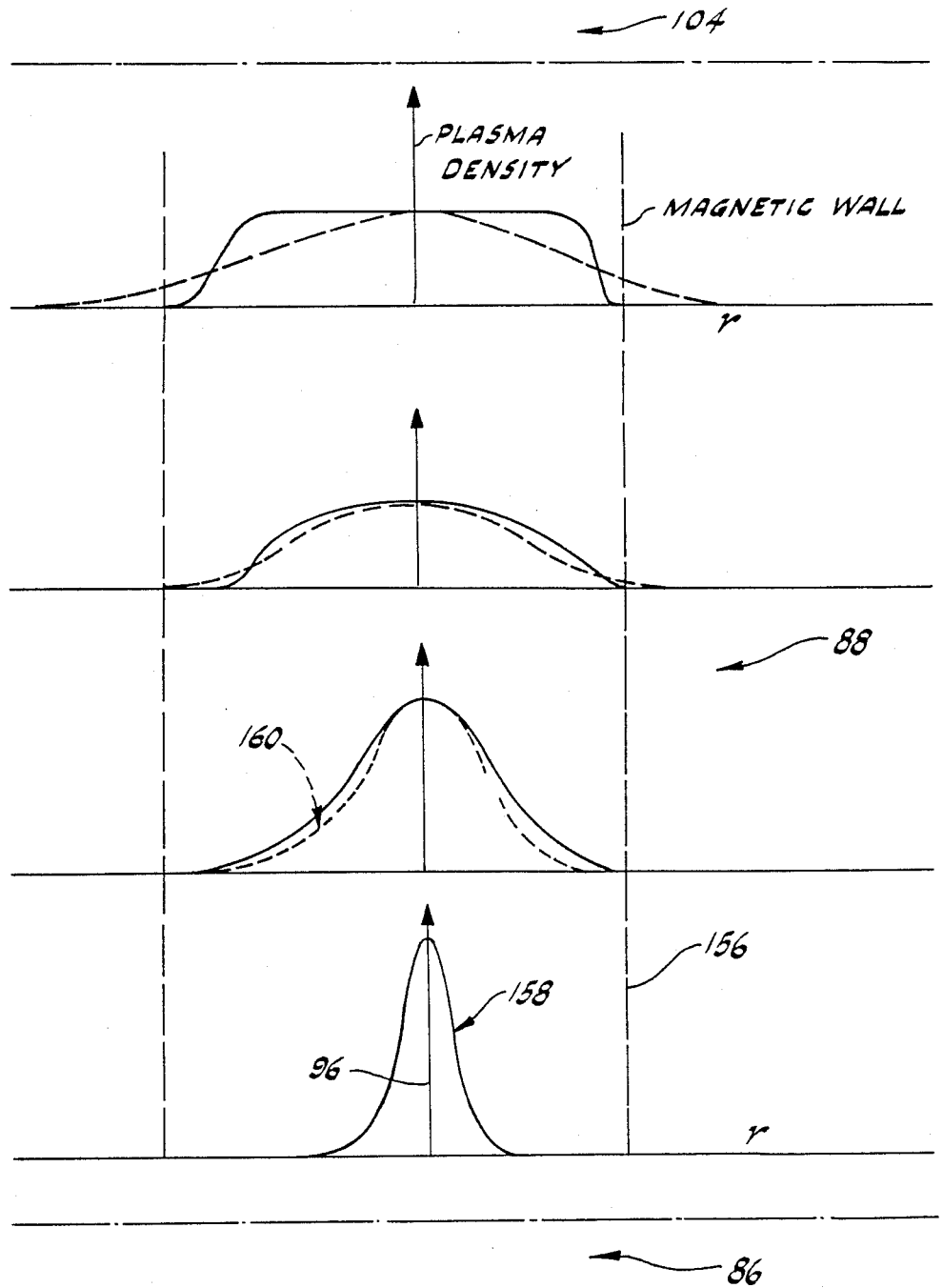
FIG. 3 is a series of graphs showing the magnetic profile of the plasma produced in the apparatus of the present invention with and without magnetic influence as the plasma travels through the second region between the first and the third regions thereof.

Turning to FIG. 3, it may be observed that the plasma plume radial density distribution 158 is depicted as expanded along region 88. "Magnetic wall" 156 pinches or flattens the density profile of plasma plume 158. Plasma plume 160, shown in dashed lines, expands without the benefit of magnetic means 100. As may be evident from FIG. 3, plasma plume 160 possesses a bell-shaped profile density near third region 104. Plasma plume 158 travels to third region 104 where the electric field formed between grids 128 and 134 extracts and accelerates ions from plasma 158, FIG. 3. The ion beam exiting region 104 possesses an intensity of 10-100 amperes, far greater than any ion beam apparatus of the prior art. The efficiency of apparatus 10, based on a comparison of the ion beam current to the arc current, has been calculated as being 5%, a substantial increase over the prior art. It should be noted that the expanding configuration of second region 88 permits relatively large extractor means or plurality of grids 106 to be employed in the present invention. Such large extractor means 106 operates without electrical breakdown as is the case in the prior art.

While, in the foregoing, embodiments of the present invention have been set forth in considerable detail for the purposes of making a complete disclosure of the invention, it may be apparent to those of skill in the art that numerous changes may be made in such details without departing from the spirit and principles of the invention.

What is claimed is:

1. A ion source utilizing a vacuum enclosure comprising:
   a. a cathode;
   b. an anode, said anode spaced apart from said cathode, within a first region in said vacuum enclosure;
   c. means for producing an electrical arc between said cathode and anode sufficient to vaporize and ionize a portion of said cathode to form a plasma in said first region and to permit travel of said plasma to a second region in the vacuum enclosure, said second region defined to permit physical expansion of said plasma transversely relative to a line between said first and second region, said second region of said vacuum enclosure including a first portion adjacent said first region and a second portion located further outwardly from said first region than said first portion of said second region, said second portion of said second region having a larger transverse dimension than said first portion of second region;
   d. means for producing a magnetic field in said second region which flattened the density profile of said plasma in said second region, said magnetic field producing means for including at least one magnetic member extending along the periphery of said second region, said magnetic member being electrically linked to said anode;
   e. means for extracting ions from said expanded plasma in a third region.

2. The ion source of claim 1 in which said means for producing a magnetic field in said second region includes a plurality of magnets arranged around said periphery of said second region.

3. The ion source of claim 2 in which said plurality of magnets are permanent magnets.

4. The ion source of claim 3 in which said plurality of permanent magnets comprise a plurality of elongated magnetic elements each having an axis of elongation, said axis of said elongated magnetic elements lying in said second region in diverging relationship from said first region.

5. The ion source of claim 4 in which said plurality of permanent magnets are bar magnets.

6. The ion source of claim 5 in which said means for producing a magnetic field further comprises an electrically conductive holding device, said holding device being electrically linked to said anode, said holding device being positioned circumferentially in said second region, said holding device further including means for fixing said plurality of magnets for extension from said first portion of said second region to said second portion of said second region.

7. The ion source of claim 1 in which said means for producing a magnetic field at least partially lies within the vacuum enclosure.

8. An apparatus for generating and confining a plasma in a vacuum chamber, comprising:
   a. a cathode;
   b. an anode, said anode spaced apart from said cathode within a first region in said vacuum chamber; and
   c. means for producing an electrical arc between said cathode and anode sufficient to vaporize and ionize a portion of said cathode to form a plasma in said first region and to permit expansion of said plasma to a second region in the vacuum chamber, said second region defined to permit physical expansion of said plasma transversely relative to a line between said first and second regions, said second region of said vacuum chamber including a first portion adjacent said first region and a second portion located further outwardly from said first region, said second portion of said second region having a larger transverse dimension than said first portion of said second region.

9. The apparatus of claim 8 in which further comprises means for producing a magnetic field in said second region which flattens for density profile of said plasma in said second region, said magnetic field producing means including at least one magnetic member extending along said line between said first and second regions and along the periphery of said second, region.

10. The apparatus of claim 9 in which said magnetic member is electrically linked to said anode to form a portion of said anode.

11. The apparatus of claim 10 in which said means for producing a magnetic field in said second region includes a plurality of magnets arranged around said periphery of said second region.

12. The apparatus of claim 11 in which said plurality of magnets are permanent magnets.

13. The apparatus of claim 12 in which said plurality of permanent magnets comprise a plurality of elongated magnetic elements each having an axis of elongation, said axis of said elongated magnetic elements lying in diverging relationship from said first region.

14. The apparatus of claim 13 in which said plurality of permanent magnets are bar magnets.

15. The apparatus of claim 8 in which said second region includes a first portion adjacent said first region and a second portion adjacent said third region, said second portion of said second region having a larger transverse dimension than said first portion of said second region.

16. The apparatus of claim 15 in which said means for producing a magnetic field further comprises an electrically conductive holding device, said holding device being electrically linked to said anode, said holding device being positioned circumferentially in said second region, said holding device further including means for fixing said plurality of magnets for extension from said first portion of said second region to said second portion of said second region.

17. The apparatus of claim in which said means for producing a magnetic field at least partially lies within the vacuum enclosure.

18. A method of producing a plasma comprising the steps of:
   a. producing an electric arc between a cathode and anode in a vacuum chamber of sufficient intensity to vaporize a portion of said cathode to produce a plasma therefrom in a first region;
   b. expanding said plasma transversely in a second region relative to a line between said first and second regions, said second region lying in said vacuum chamber, said second region including divergent wall portions extending outwardly from said first region; and
   c. providing a magnetic field to flatten the density profile of said plasma in said second region utilizing at least one magnetic member extending along said second region said magnetic member being electrically linked to said anode.

19. The method of claim 18 in which said step of providing a magnetic field further comprises providing a plurality of magnets in the vacuum chamber, said plurality of magnets along said divergent wall portions thereof.

20. The method of claim 18 which comprises the additional step of extracting ions from said expanded plasma in a third region.

* * * * *